United States Patent
van Meer et al.

(10) Patent No.: US 9,231,079 B1
(45) Date of Patent: Jan. 5, 2016

(54) STRESS MEMORIZATION TECHNIQUES FOR TRANSISTOR DEVICES

(71) Applicant: GLOBALFOUNDRIES Inc., Grand Cayman (KY)

(72) Inventors: Johannes M. van Meer, Delmar, NY (US); Cuiqin Xu, Malta, NY (US); Isabelle Ferain, Ballston Spa, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/304,017

(22) Filed: Jun. 13, 2014

(51) Int. Cl.
| | |
|---|---|
| *H01L 21/336* | (2006.01) |
| *H01L 29/66* | (2006.01) |
| *H01L 29/78* | (2006.01) |
| *H01L 21/324* | (2006.01) |
| *H01L 21/266* | (2006.01) |

(52) U.S. Cl.
CPC ........ *H01L 29/66492* (2013.01); *H01L 21/266* (2013.01); *H01L 21/324* (2013.01); *H01L 29/7847* (2013.01); *H01L 29/7848* (2013.01)

(58) Field of Classification Search
CPC ............ H01L 29/6659; H01L 29/7833; H01L 29/7847; H01L 29/7848; H01L 29/32; H01L 29/66492; H01L 21/26506; H01L 21/266; H01L 21/324
USPC .................. 438/305, 528, 306, 530, 303, 527
See application file for complete search history.

(56) References Cited

U.S. PATENT DOCUMENTS

| | | | |
|---|---|---|---|
| 7,700,450 B2 * | 4/2010 | Lee et al. ....................... | 438/301 |
| 8,343,825 B2 * | 1/2013 | Domenicucci et al. ........ | 438/197 |
| 2014/0151762 A1 * | 6/2014 | Wang et al. .................... | 257/288 |

* cited by examiner

*Primary Examiner* — Michael Trinh
(74) *Attorney, Agent, or Firm* — Amerson Law Firm, PLLC

(57) ABSTRACT

One illustrative method disclosed herein includes, among other things, performing a source/drain extension ion implantation to form a doped extension implant region in the source/drain regions of the device, performing an ion implantation process on the source/drain regions with a Group VII material (e.g., fluorine), after performing the Group VII material ion implantation process, forming a capping material layer above the source/drain regions, and, with the capping material layer in position, performing an anneal process so as to form stacking faults in the source/drain regions.

25 Claims, 9 Drawing Sheets

STRESS MEMORIZATION TECHNIQUES FOR TRANSISTOR DEVICES

BACKGROUND OF THE INVENTION

1. Field of the Disclosure

The present disclosure generally relates to the formation of semiconductor devices and, more specifically, to various stress memorization techniques that may be employed when manufacturing transistor devices.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein field effect transistors (NMOS and PMOS transistors) represent one important type of circuit element used in manufacturing such integrated circuit devices. A field effect transistor, irrespective of whether an NMOS transistor or a PMOS transistor is considered, typically comprises doped source and drain regions that are formed in a semiconducting substrate that are separated by a channel region. A gate insulation layer is positioned above the channel region and a conductive gate electrode is positioned above the gate insulation layer. By applying an appropriate voltage to the gate electrode, the channel region becomes conductive and current is allowed to flow from the source region to the drain region.

Device designers are under constant pressure to increase the operating speed and electrical performance of transistors and integrated circuit products that employ such transistors. Given that the gate length (the distance between the source and drain regions) on current generation transistor devices may be approximately 20-50 nm, and that further scaling is anticipated in the future, device designers have employed a variety of techniques in an effort to improve device performance, e.g., the use of high-k dielectrics, the use of metal gate electrode structures, the incorporation of work function metals in the gate electrode structure, etc. Another technique that device designers have employed to improve device performance is to induce a desired stress in the channel region of a device, i.e., induce a tensile stress in the channel region of an NMOS device (to improve the mobility of charge-carrying electrons) and induce a compressive stress in the channel region of a PMOS device (to improve the mobility of charge-carrying holes). Various stress-memorization techniques are known to those skilled in the art.

One typical prior art process flow that is performed to form NMOS transistors with the desired tensile stress in a CMOS application is as follows. After the gate structures are formed, N-type extension implants are formed for the N-type devices with the P-type devices masked, a first spacer is formed on both the N- and P-type devices, extension and halo implants are performed on the P-type devices with the N-type devices masked, a second spacer is formed of the P-type devices, a cavity is etched in the source/drain regions of the P-type devices and an epi semiconductor material is formed in the cavities on the P-type devices. Thereafter, a second spacer is formed on the N-type devices, an amorphization implant process (Germanium—55 keV, $3e^{14}$ ion/cm² dose) is performed using a material such as germanium to amorphize the source/drain region. Next, a so-called SMT (Stress Memorization Techniques) processing module is performed on the N-type device. The SMT module involves forming a layer of silicon dioxide (e.g., about 4 nm thick) on the substrate, forming a capping material layer, e.g., a thick layer of silicon nitride (e.g., about 40 nm thick) with the desired intrinsic stress, heating the device for about 10 minutes at 750° C. in a nitrogen environment. Thereafter, the layer of silicon nitride and the layer of silicon dioxide are removed by performing one or more etching processes. Then, raised source/drain regions are formed by depositing epi semiconductor material in the source/drain areas of the device. Thereafter, deep source/drain implant regions are formed by performing an ion implantation process. A heating process is later performed to repair damage to the lattice structure of the substrate due to the amorphization implant process and the other ion implantation processes that were performed on the substrate up to this point in the process flow.

FIG. 1 is a TEM photograph of an integrated circuit product 10 that includes a plurality of NMOS transistors formed above an active region 11 defined in a semiconductor substrate by an illustrative isolation region 12. As depicted, the transistors comprise a gate electrode structure 16 and raised source/drain regions 18. Ideally, by performing stress memorization techniques, stacking faults 14 (sometimes referred to as edge dislocations within the industry) will be formed in the active region 11 in the source/drain areas 18 of the devices. Ideally, for current generation devices with very small gate lengths and very tight gate spacing (pitch), the stacking faults 14 will have an inverted "V" shaped configuration, as depicted in the dashed-line region 20, for a [100] substrate. The stacking faults 14 may have a configuration other than the depicted inverted "V" for devices formed on substrates other than a [100] substrate, i.e., the angle of the downward-pointing "legs" of the inverted "V" shaped stacking faults 14 may be different when the substrate has a different crystallographic orientation. In some applications, the dislocations may not even intersect one another, i.e., the stacking faults may not intersect one another so as to form the "apex" of the inverted "V" shaped stacking faults. Thus, the above reference to the stacking faults 14 having an inverted "V" shaped configuration is only a shorthand reference. However, with respect to the transistors formed adjacent the edge of the isolation region 12, such stacking faults 14 do not form in the source/drain regions of the device, as reflected by the absence of such stacking faults 14 in the dashed-line regions 22. The lack of the stacking faults 14 indicates that the particular transistor device did not receive any significant benefit from performing the process operations associated with the SMT module, i.e., the source/drain regions of such NMOS devices do not have the desired stacking faults 14. Accordingly, the transistors where the stacking faults 14 are absent, or at least not fully formed, will not perform as well as a transistor device where the stacking faults 14 are present, as depicted in the dashed line region 20 shown in FIG. 1. Some attempts have been made to use hydrogen-rich silicon nitride as the stress-inducing material layers to improve the formation of the desired stacking faults 14.

The present disclosure is directed to various stress memorization techniques that may reduce or eliminate one or more of the problems identified above.

SUMMARY

The following presents a simplified summary of the disclosure in order to provide a basic understanding of some aspects of the disclosure. This summary is not an exhaustive overview. Its sole purpose is to present some concepts in a simplified form as a prelude to the more detailed description that is discussed later.

Generally, the present disclosure is directed to various stress memorization techniques that may be employed when manufacturing transistor devices. One illustrative method disclosed herein includes, among other things, performing a source/drain extension ion implantation process with a dopant material to thereby form a doped extension implant region in the source/drain regions, performing a Group VII material ion implantation process on the source/drain regions with a Group VII material, after performing the Group VII material ion implantation process, forming a capping material layer above the source/drain regions and with the capping material layer in position, performing an anneal process so as to form stacking faults in the source/drain regions.

Another illustrative method disclosed herein includes, among other things, performing a source/drain extension ion implantation process with a dopant material to thereby form a doped extension implant region in the source/drain regions, performing an amorphization ion implantation process on the source/drain regions, performing a Group VII material ion implantation process on the source/drain regions with a Group VII material, after performing the Group VII material ion implantation process, forming a capping material layer above the source/drain regions, and, with the capping material layer in position, performing an anneal process so as to form stacking faults in the source/drain regions.

Yet another illustrative method disclosed herein includes, among other things, performing a source/drain extension ion implantation process with an N-type dopant material to thereby form a doped extension implant region in the source/drain regions, performing an amorphization ion implantation process on the source/drain regions, performing a fluorine ion implantation process on the source/drain regions, after performing the fluorine ion implantation process, forming a capping material layer above the source/drain regions, and, with the capping material layer in position, performing an anneal process so as to form stacking faults in the source/drain regions.

BRIEF DESCRIPTION OF THE DRAWINGS

The disclosure may be understood by reference to the following description taken in conjunction with the accompanying drawings, in which like reference numerals identify like elements, and in which.

Figure 1:
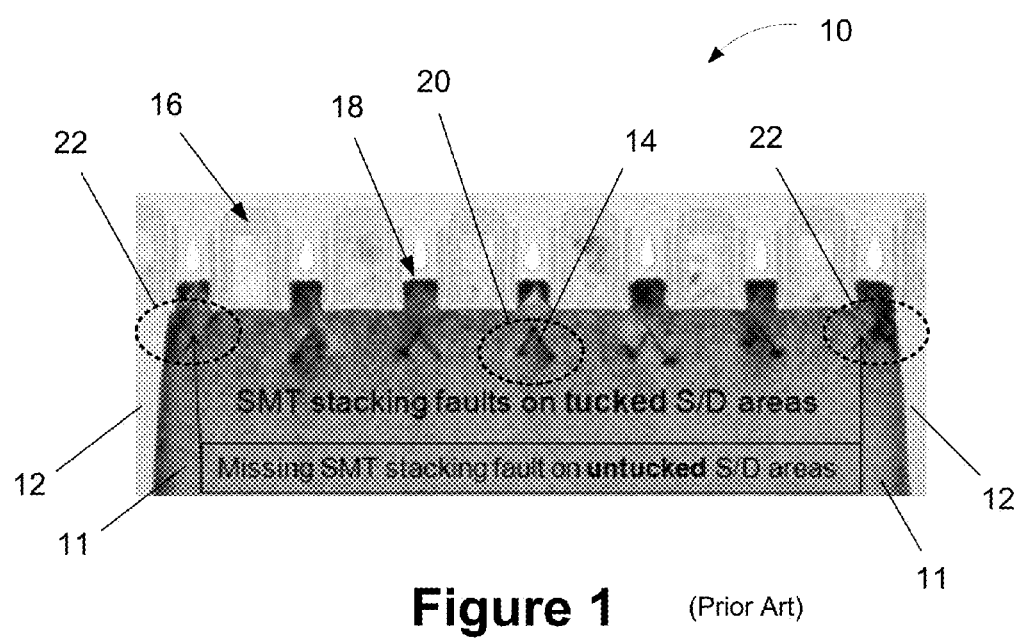
FIG. 1 depicts a prior art device wherein stacking faults have been formed in the source/drain regions of some of the transistor devices shown therein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the disclosure to the particular forms disclosed, but on the contrary, the intention is to cover all modifications, equivalents, and alternatives falling within the spirit and scope of the disclosure as defined by the appended claims.

NOTATION AND NOMENCLATURE

Certain terms are used throughout the disclosure to refer to particular components. However, different entities may refer to a component by different names. This document does not intend to distinguish between components that differ in name but not function. The terms "including" and "comprising" are used herein in open-ended fashion, and thus mean "including, but not limited to."

DETAILED DESCRIPTION

The present subject matter will now be described with reference to the attached figures. Various structures, systems, and devices are schematically depicted in the drawings for purposes of explanation only. The attached drawings are included to describe and explain illustrative examples of the present disclosure. The words and phrases used herein should be understood and interpreted to have a meaning consistent with the understanding of those words and phrases by those in the industry. No special definition of a term or phrase, i.e., a definition that is different from the ordinary and customary meaning as understood by those in the industry, is intended to be implied by consistent usage of the term or phrase herein. To the extent that a term or phrase is intended to have a special meaning, such a special definition will be expressly set forth in the specification in a definitional manner that directly and unequivocally provides the special definition for the term or phrase.

The present disclosure is directed to various stress memorization techniques that may be employed when manufacturing transistor devices. As will be readily apparent, the present method is applicable to a variety of devices, including, but not limited to, logic devices, memory devices, etc., and the methods disclosed herein may be employed to form N-type or P-type semiconductor devices. Additionally, various doped regions, e.g., source/drain regions, halo implant regions, well regions and the like, are not depicted in the attached drawings. Of course, the inventions disclosed herein should not be considered to be limited to the illustrative examples depicted and described herein. The various components and structures of the device 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

The inventors have discovered that, by performing a implantation process using a Group VII material (from the periodic table), such as fluorine, such stacking faults may be desirably formed for devices having a very small LOD (Length of Diffusion—the dimension between the edge of the gate structure at issue and the edge of the active region), even for devices that are located adjacent the free surface of the active region, i.e., the interface between the active region and the isolation material.

Figure 2A:
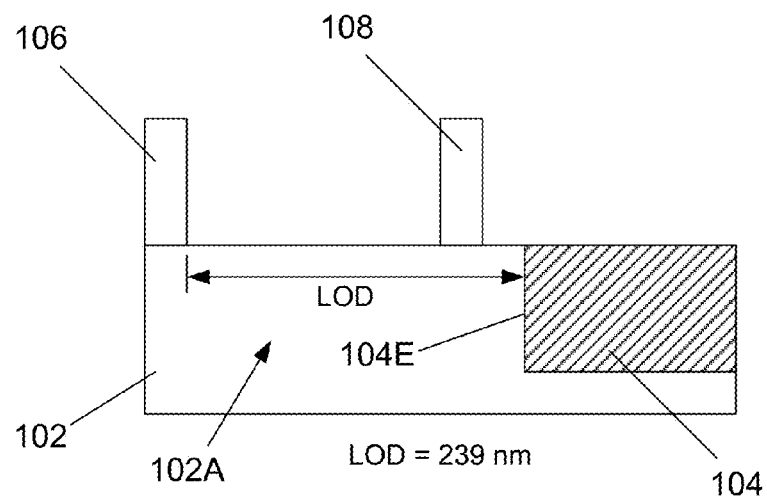
FIGS. 2A-2C depict various aspects of forming stacking faults in transistor devices.
Figure 2A:
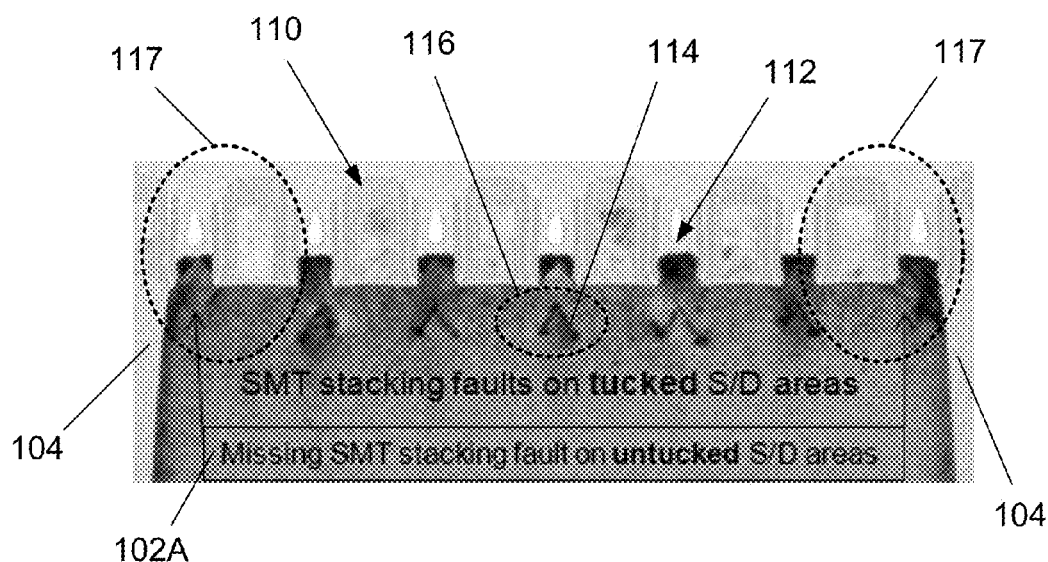
Figure 2B:
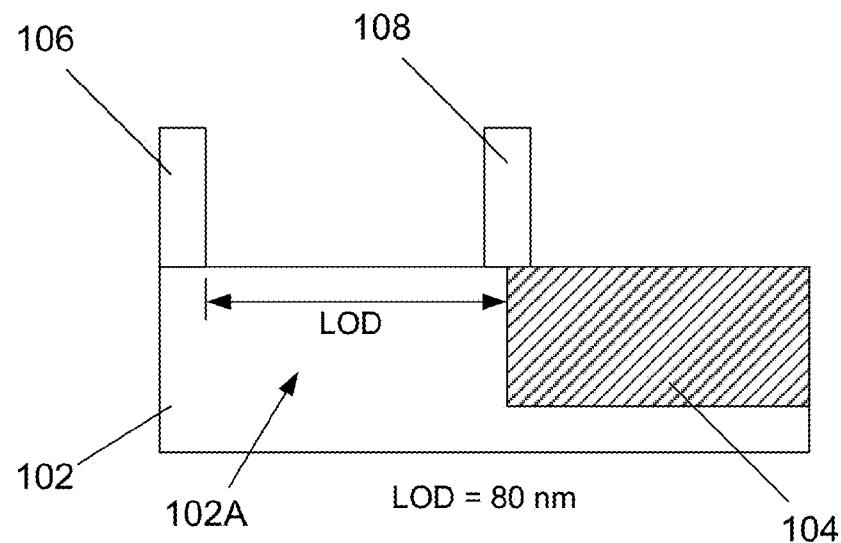
Figure 2B:
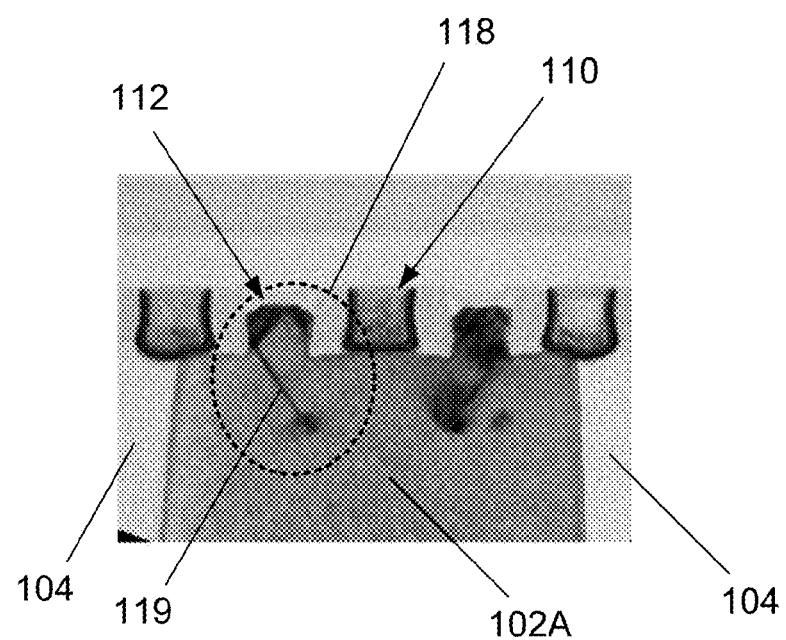
Figure 2C:
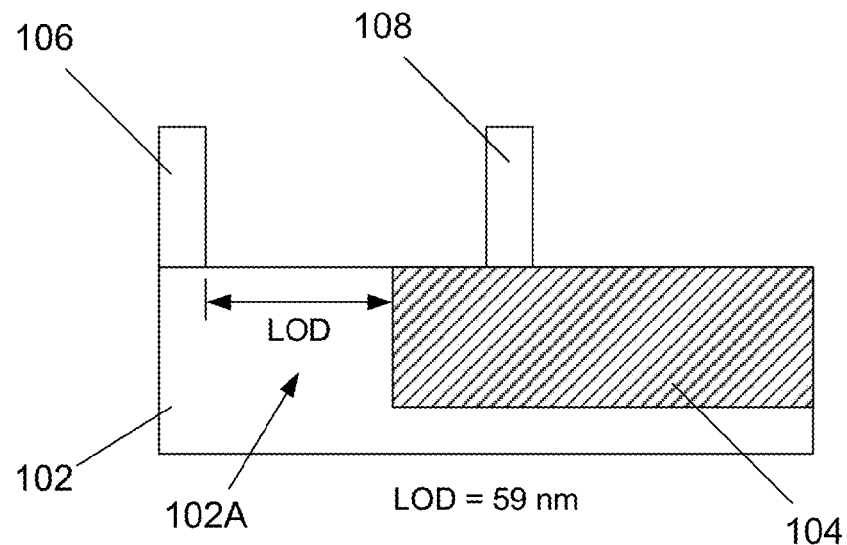
Figure 2C:
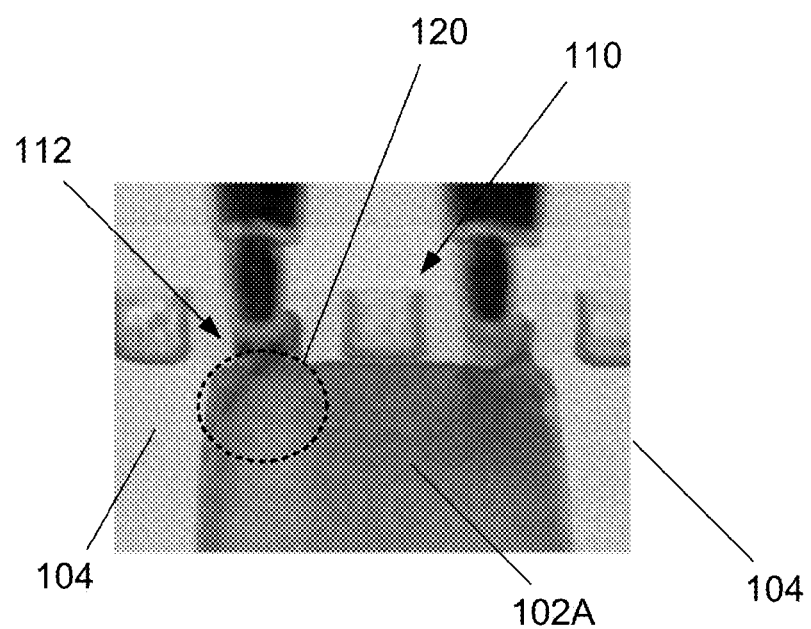

FIGS. 2A-2C contain a simplistic cross-sectional drawing (upper drawing) of an integrated circuit test product and a TEM photograph (lower drawing) depicting a cross-sectional view of such a manufactured integrated circuit test product. In these drawings, an active region 102A has been defined in a substrate 102 by forming an isolation structure 104, such as a trench isolation structure, in the substrate 102. Also schematically depicted is an illustrative test transistor 106 (i.e., a device under test), as well as a "dummy" gate structure 108. The gate structures are ground-rule-minimum structures, i.e., the critical dimension of the gate structures 106, 108 is made as small as possible, e.g., a critical dimension of about 20-40 nm using current day technology. FIGS. 2A-2C depict a situation where the LOD of the devices 106 is 239 nm, 80 nm and 59 nm, respectively, and wherein the gate structures and the raised source/drain regions are identified using the reference numbers 110, 112, respectively.

As indicated in FIG. 2A, for the device under test 106, the LOD was 239 nm. Both the tested device 106 and the dummy device 108 were formed above the active region 102A. The device under test 106 is said to be a "tucked" device in that there is a dummy device 108 positioned between the device under test 106 and the edge of the isolation region 104. Such a "tucked" device may also be referred to as being "PC bounded," i.e., the gate (PC) of the dummy transistor is positioned between the device under test 106 and the isolation region 104. In contrast, an "untucked" device (as shown in FIG. 2C) is one where there is no dummy device 108 positioned between the device under test 106 and the isolation region 104. An "untucked" device may also be referred to as being "STI bounded." As indicated, the desirable stacking faults 114 are fully formed in many of the transistor devices formed above the active region 102A, e.g., see the dashed-line region 116. However, such stacking faults 114 are absent or only partially formed in the source/drain region of the untucked transistors (in dashed-line circles 117) adjacent the edge of the isolation region 104.

FIG. 2B depicts a situation where the LOD was 80 nm. The tested device 106 was formed above the active region 102A and the dummy device 108 was formed partially on the active region 102A and partially on the isolation region 104 (i.e., another tucked device situation). As shown, the desirable stacking faults 119 are only partially formed in transistor devices formed above the active region 102A, e.g., see the dashed-line region 118. None of the devices exhibited the desired, fully formed, stacking faults 114 like those depicted in the devices in FIG. 2A. This is believed to have occurred due to the relatively small LOD and the nearness of free surfaces, i.e., the edges of the active region 102A, which may allow for at least partial stress relaxation of the stresses that exist in the active region 102A.

FIG. 2C depicts a situation where the LOD was 59 nm. As indicated, only the tested device 106 was formed above the active region 102A. The dummy device 108 was formed completely above the isolation region 104 (i.e., an "untucked" device situation). As shown, there is an absence of any of the desirable stacking faults 114 in the source/drain regions of the transistor device, as indicated in the dashed-line region 120. This is believed to have occurred due to the small LOD and the nearness of free surfaces, i.e., the edges of the active region 102A, which may allow for substantially complete relaxation of the stresses that exist in the active region 102A. Unfortunately, the situation depicted in FIG. 2C results in a significant degradation of the electrical performance characteristics of the device shown in FIG. 2C as compared to the devices shown in FIGS. 2A-2B. More specifically, on average, the arrangement depicted in FIG. 2C results in a decrease in the DC drive current of the device shown in FIG. 2C relative to the drive current of the devices shown in FIGS. 2A-2B (which is approximately the same for the device configurations shown in FIGS. 2A-2B), by about 12%.

Some prior art methods have been attempted to improve the formation of the desired stress in N-type transistors. One prior art technique involves formation of a hydrogen-rich silicon nitride layer as a stress memorization layer in an effort to form the desired stacking faults 114 in N-type devices. However, such attempts have typically resulted in only, at best, the partial formation of the desired stacking faults 114 in the source/drain region of the device and only for tucked devices. Untucked devices did not show any appreciable stacking faults using this prior art method.

Figure 3A:
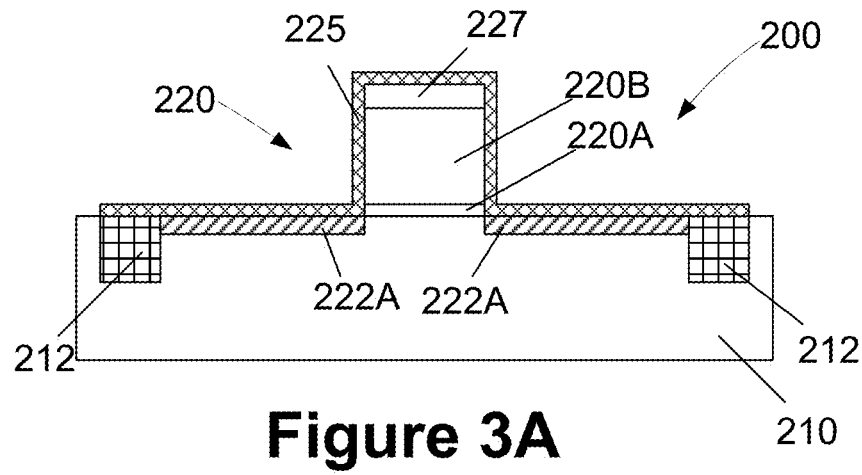
FIGS. 3A-3J depict various illustrative embodiments of stress memorization techniques disclosed herein that may be employed when manufacturing transistor devices.

FIGS. 3A-3J depict various illustrative embodiments of stress memorization techniques disclosed herein that may be employed when manufacturing transistor devices. FIG. 3A is a simplified view of an illustrative NMOS transistor 200 at an early stage of manufacturing. The transistor 200 is formed in and above an active region of a semiconducting substrate 210 that is defined by an illustrative trench isolation structure 212 formed in the substrate 210. The substrate 210 may have a variety of configurations, such as the depicted bulk silicon configuration. The substrate 210 may also have a silicon-on-insulator (SOI) configuration that includes a bulk silicon layer, a buried insulation layer and an active layer, wherein semiconductor devices are formed in and above the active layer. Thus, the terms substrate or semiconductor substrate should be understood to cover all semiconductor structures. The substrate 210 may also be made of materials other than silicon.

At the point of fabrication depicted in FIG. 3A, the transistor 200 includes a schematically depicted gate structure 220 that typically includes an illustrative gate insulation layer 220A and an illustrative gate electrode 220B. The gate insulation layer 220A may be comprised of a variety of different materials, such as, for example, silicon dioxide, a so-called high-k (k greater than 10) insulation material, etc. Similarly, the gate electrode 220B may also be of a material such as polysilicon or amorphous silicon, or it may be comprised of one or more metal layers that act as the gate electrode 220B. As will be recognized by those skilled in the art after a complete reading of the present application, the gate structure 220 of the transistor 200 depicted in the drawings, i.e., the gate insulation layer 220A and the gate electrode 220B, is intended to be representative in nature. That is, the gate structure 220 may be comprised of a variety of different materials and it may have a variety of configurations, and the gate structure 220 may be made manufactured using either so-called "gate-first" or "replacement-gate" processing techniques. For ease of explanation, the illustrative transistor 200 will be depicted as having a polysilicon gate electrode 220B, however, the present invention should not be considered as limited to such an illustrative embodiment.

With continuing reference to FIG. 3A, also depicted are a liner layer 225, a gate cap layer 227, e.g., silicon nitride, and so-called extension implant regions 222A. The extension implant regions 222A are formed in the substrate 210 by performing an ion implantation process through a photoresist mask (not shown), i.e., by implanting an N-type dopant for the NMOS transistor 200. Although not depicted in the drawings, at the point of fabrication depicted in FIG. 3A, so-called halo implant regions (not shown) have been formed in the substrate 210 typically by performing an angled ion implant process (with a P-type dopant for an NMOS transistor). The various structures and regions of the transistor 200 depicted in FIG. 3A may be formed by performing well-known processes. For example, the gate structure 220 may be formed by depositing various layers of material and thereafter performing one or more etching processes to define the basic layer stack of the gate structure 220 as well as the gate cap layer 227. The liner layer 225 may be comprised of a relatively thin, e.g., 2-3 nm, layer of, for example, silicon dioxide, that is formed by performing a conformal chemical vapor deposition (CVD) process.

Figure 3B:
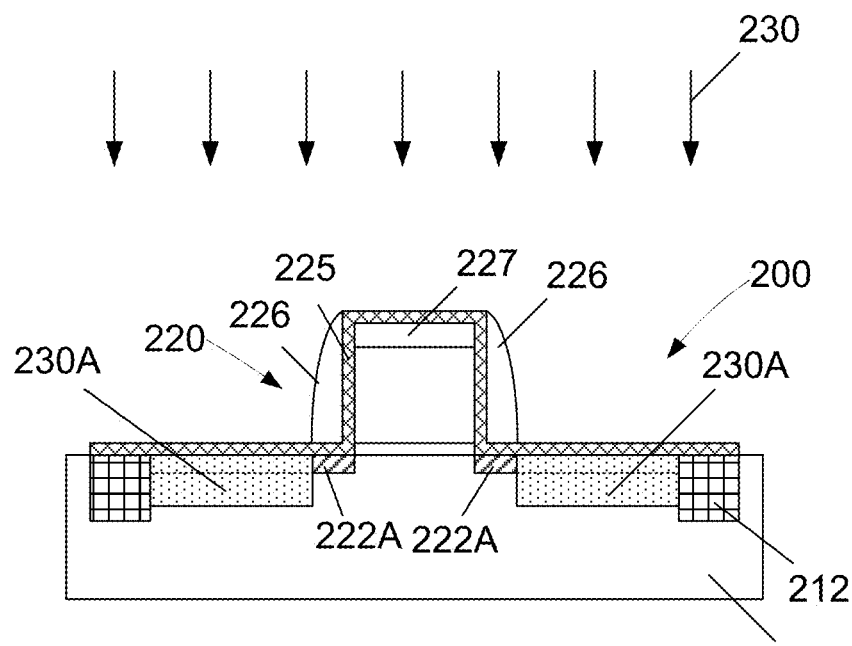

FIG. 3B depicts the device 200 after several additional process operations were performed. First, sidewall spacers 226 were formed adjacent the gate structure 220. The sidewall spacer 226 may be formed by depositing a layer of spacer material, e.g., silicon nitride, and thereafter performing an anisotropic etching process on the layer of spacer material so as to result in the spacers 226 depicted in the FIG. 3B. The base thickness or width of the spacers 226 may vary depending upon the particular application. Next, in one particular process flow, an amorphization implant process 230 was performed to form amorphized regions 230A in the substrate 210 in the areas of the source/drain regions of the device 200. The amorphization implantation process 230 may be performed using a variety of elements, e.g., germanium, silicon, fluorine, etc. In one embodiment, the amorphization implant process 230 may be performed using germanium or silicon with an implant energy of about 10-100 keV and a dopant dose of about $1e^{14}$-$1e^{16}$ ions/cm$^2$. In one very particular example, the amorphization implant process may be performed using germanium with an implant energy of about 55 keV and a dopant dose of about $3e^{14}$. Although it appears from the drawings that the amorphized regions 230A have replaced or removed portions of the extension implant regions 222A, that is not the case, as the implanted dopant materials in the extension implant regions 222A remain in substantially the same position as originally implanted (as reflected by the dashed line). The depth of the amorphized regions 230A may vary depending upon the particular application, e.g., 30-80 nm as one example.

Figure 3C:
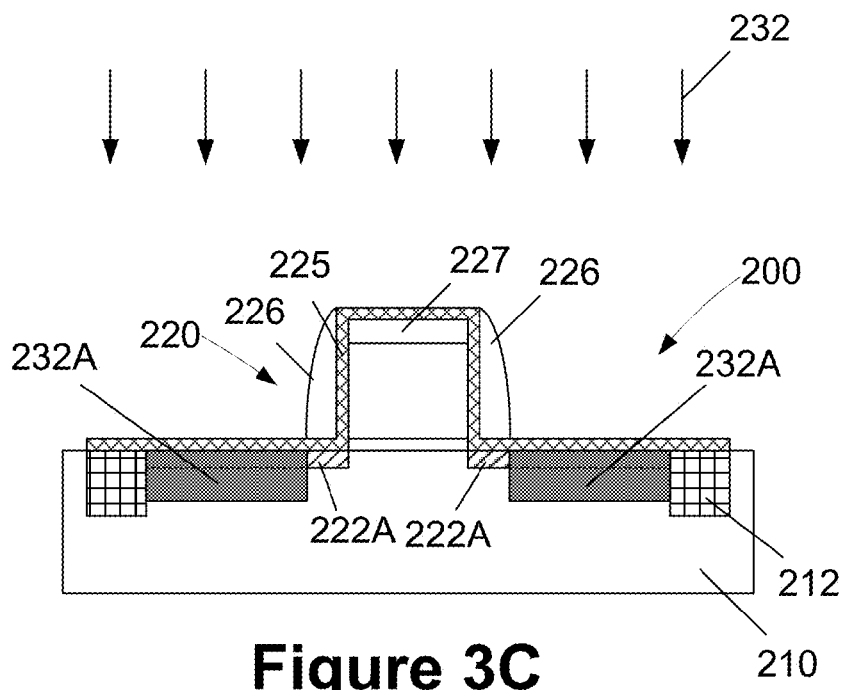

FIG. 3C depicts the device 200 after a Group VII implantation process 232 was performed to form implant regions 232A in the substrate 210 in the areas of the source/drain regions of the device 200. The Group VII implantation process 232 may be performed using a variety of elements. In one embodiment, the Group VII implant process 232 may be performed using a material from Group VII of the Periodic Table of Elements, such as fluorine. In some applications, a separate amorphization implantation step 230 and a separate Group VII implantation step 232 may not need to be performed. That is, is some cases, a single implantation process may serve the purpose of both the amorphization implant process 230 and the Group VII implantation process 232, e.g., fluorine may be implanted to amorphize the source/drain regions as well as to generally introduce the Group VII material into the source/drain regions. Of course, the implant energy and implant dose of the Group VII material may vary depending upon the precise process flow selected. Even when a separate Group VII implantation process 232 is performed, the implant energy and implant dose of the Group VII implant process 232 may vary depending upon the application. In one illustrative embodiment, where fluorine is the implant material in the Group VII implantation process 232, the implant energy may range from about 1-30 keV and the dose of fluorine may fall within the range of about $1e^{14}$-$1e^{16}$ ions/cm$^2$. In the depicted example, the Group VII implant process 232 is performed after the amorphization implantation process 230. However, if desired, the Group VII implant process 232 may be performed before the amorphization implantation process 230. Additionally, the depth of the implant regions 232A may vary with the application. In general, the depth of the implant regions 232A should be such that the vast majority of the implant regions 232A will be positioned within the amorphized regions 230A when the implantation sequence (in whatever order) is completed. No attempt has been made to show the amorphized regions 230A in FIG. 3C so as not to overly complicate the drawing.

Figure 3D:
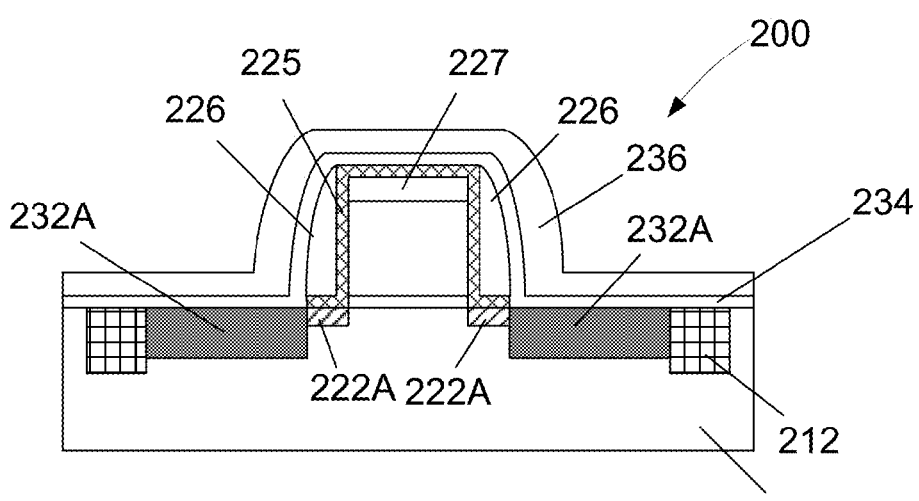

FIG. 3D depicts the device 200 after several process operations were performed. First, an etching process was performed to remove the exposed portion of the liner layer 225. Then, a liner layer 234, e.g., a thin (about 4 nm) silicon dioxide liner layer, was conformably deposited on the device 200 by performing a CVD or ALD process. Thereafter, a capping material layer 236 was formed above the transistor 200. The capping material layer 236 may be comprised of a material such as silicon nitride and it may have a thickness of about 20-80 nm. The capping material layer 236 may be formed with or without any intrinsic stress.

Figure 3E:
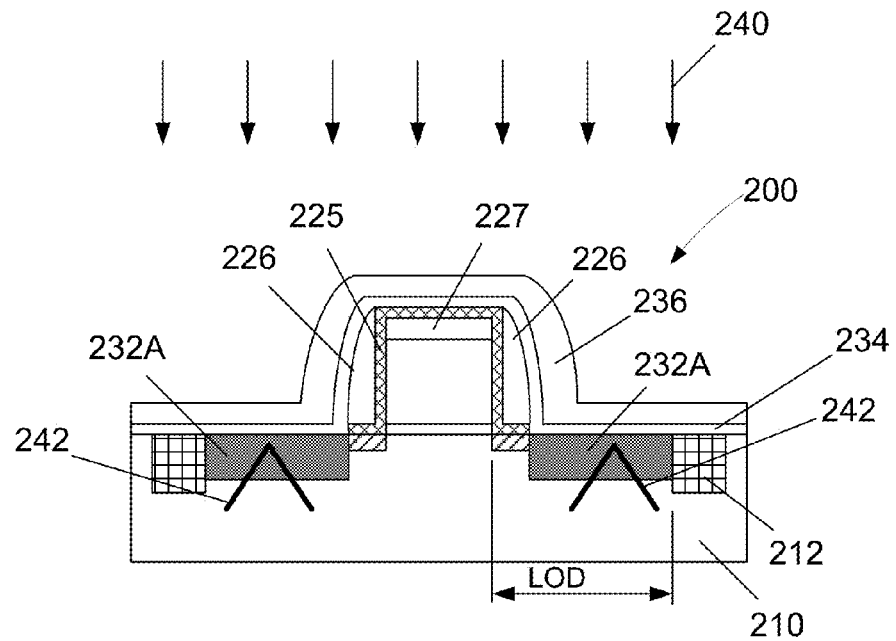

As shown in FIG. 3E, an anneal process 2240 (e.g., at least about 600° C. for a duration of about 10 minutes in an inert ambient (e.g., N$_2$)) was performed on the device 200. As depicted, this results in the formation of the schematically depicted stacking faults 242 in the source/drain regions of the device 200. In the depicted example, the device has a very small LOD of about 80 nm, and the gate structure 220 has a critical dimension of about 20-40 nm, i.e., about the smallest allowable under the design rules that govern fabrication of the integrated circuit product that includes the device 200. However, using the novel implantation process 232 described above, fully formed stacking faults 242 were created on the device 200, where they were not created using traditional manufacturing processes on a similarly sized device. See FIG. 2C and the discussion above.

Figure 3F:
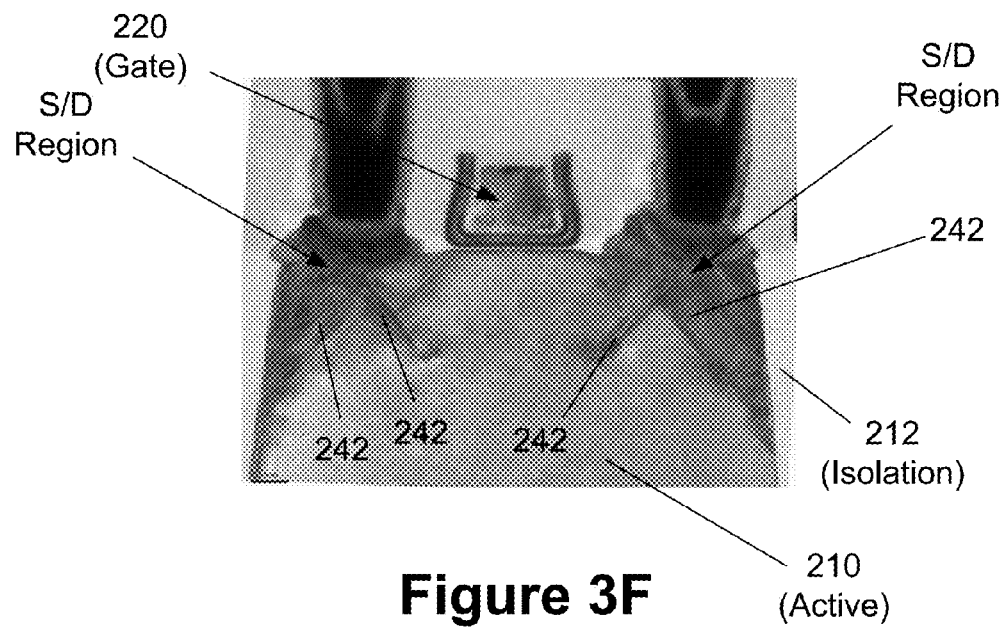

FIG. 3F is a TEM of a device fabricated using the methods disclosed herein wherein the implant process 232 was performed after the amorphization implantation process 230. As depicted, contrary to prior art processing techniques, the device exhibited well-formed stacking faults 242. Without seeking to limit the inventions disclosed herein, it is believed that the introduction of the Group VII material, such as fluorine, into the substrate lowers the formation energy for such stacking faults 242. Thus, for devices with small LOD dimensions, the stacking faults 242 still form even though they are located adjacent the free surface of the active region, i.e., the interface between the active region and the isolation material. Of course, for devices with longer LODs that are located remote from the edge of the active region, the desired stacking faults 242 will still form. As noted above, the small LOD device shown in FIG. 2C exhibited a significant degradation of the electrical performance characteristics of the device, e.g., a decrease in the DC drive current of the device shown in FIG. 2C relative to the drive current of the devices shown in FIGS. 2A-2B (which is approximately the same for the device configurations shown in FIGS. 2A-2B), by about 12%. However, using the novel Group VII implant process 232 disclosed herein, where fluorine was used as the implant material, the device 200, which corresponds approximately to the device shown in FIG. 2C in terms of dimensions, exhibited better relative electrical performance. More specifically, there was about 10% less DC drive current loss for the device 200 (for various LODs) relative to a reference device with a long LOD (239 nm) formed using prior art methods disclosed in the background section of this application. Additionally, the device 200 formed using the methods disclosed herein exhibited less degradation of threshold voltage levels as compared to the devices formed using prior art methods disclosed in the background section of this application, e.g., about 20 mV less change in threshold voltage levels for the device disclosed herein (for various LODs) relative to a reference device with a long LOD (239 nm).

Figure 3G:
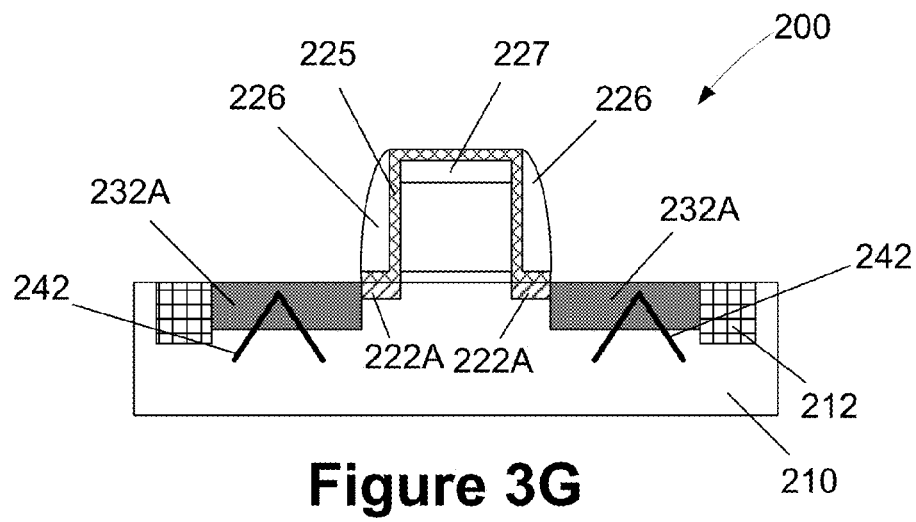

FIG. 3G depicts the device 200 after the capping material layer 236 and the liner layer 234 were sequentially removed from the device 200 by performing one or more etching processes.

Figure 3H:
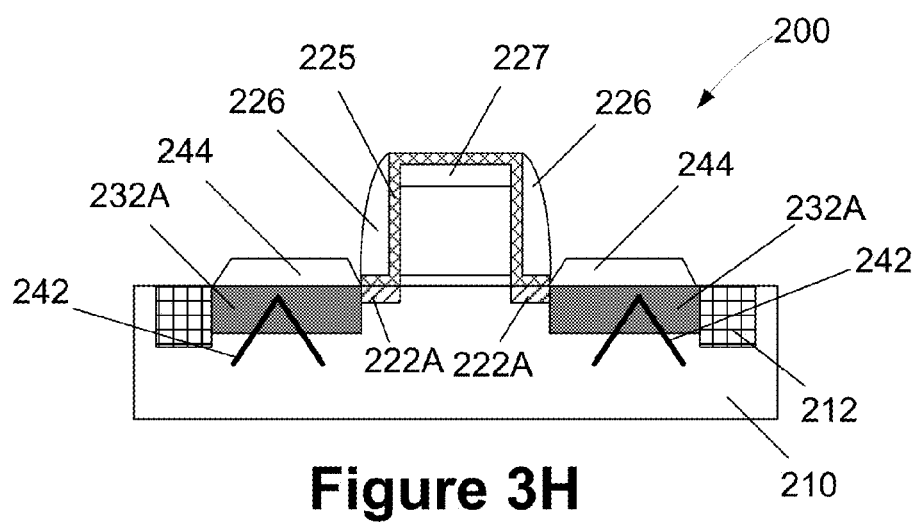

FIG. 3H depicts the device 200 after an epitaxial deposition process was performed to grow additional semiconductor material 244 on the source/drain regions of the device 200. This semiconductor material 244 will constitute an upper portion of the final raised source/drain regions of the transistor 200. The semiconductor material 244 may be comprised of a variety of different materials, e.g., silicon, silicon germanium, silicon carbon, silicon phosphorous, silicon carbon phosphorous, etc.

Figure 3I:
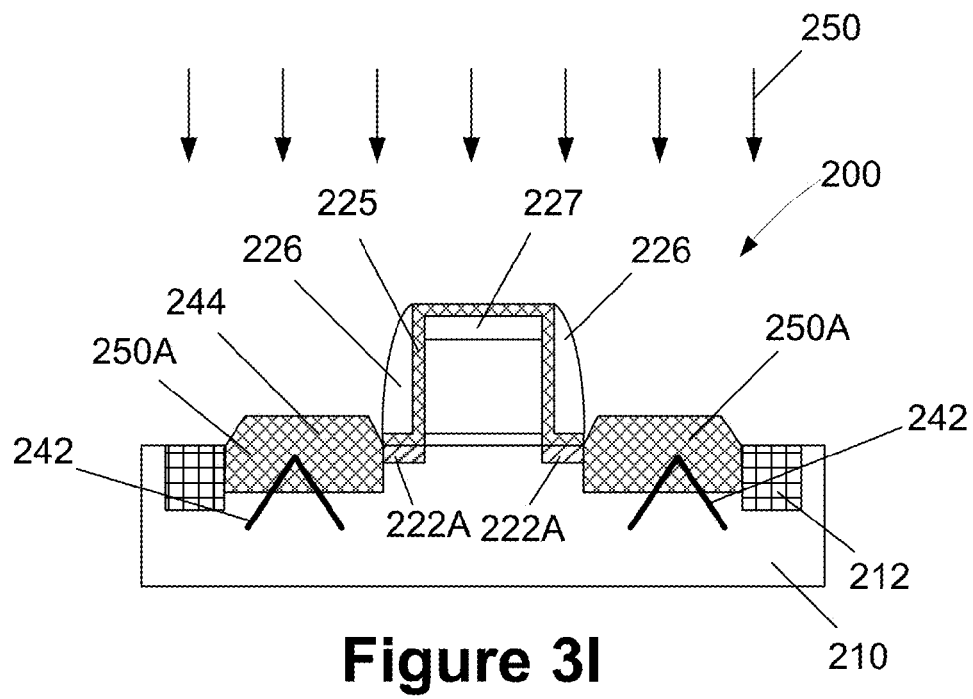

FIG. 3I depicts the device 200 after a deep source/drain implantation process 250 was performed to introduce the desired dopant material 250A into the source/drain regions of the device 200.

Figure 3J:
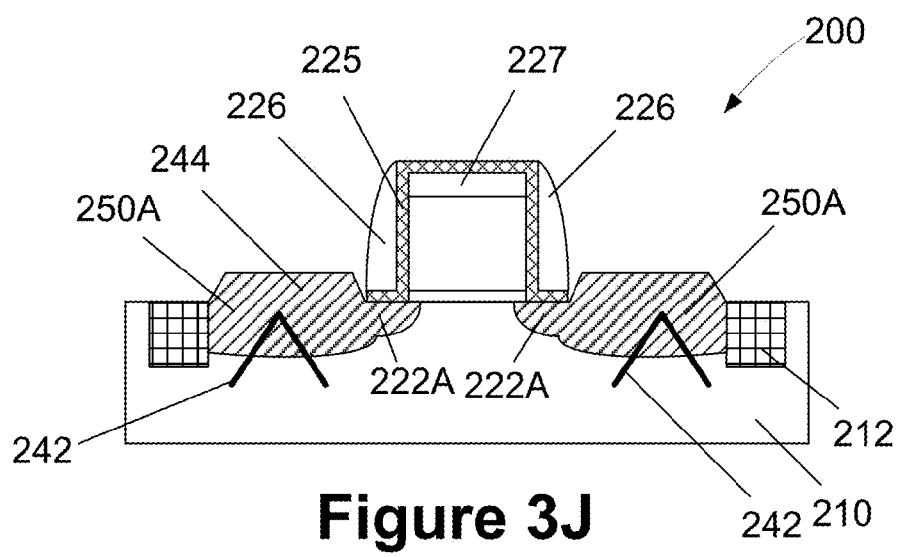

FIG. 3J depicts the device after an anneal process was performed to repair any damage to the crystalline structure of the substrate 210 and to activate the implanted dopant materials. This anneal process repairs the amorphized regions 230A, i.e., they are restored to the original crystalline structure of the substrate. At the point of processing depicted in FIG. 3J, additional processing operations may be performed to incorporate the device into an integrated circuit, e.g., the formation of source/drain contacts, the formation of a gate contact, and the formation of various metallization layers above the device 200.

It should be noted that, as will be appreciated by those skilled in the art, the present invention is not limited to devices 200 where raised source/drain regions are formed. In applications where the device 200 includes traditional non-raised source/drain regions, the above described Group VII implantation process 232 may be performed after the above-described deep source/drain implant process 250 was performed. In such an example, the method would then involve formation of the liner layer 234 and the capping material layer 236 and thereafter performing the above-described anneal process 240 to produce the desired stacking faults 242.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a transistor device comprising a gate structure and a plurality of source/drain regions, the method comprising:
    performing a source/drain extension ion implantation process with a dopant material to thereby form a doped extension implant region in said source/drain regions;
    performing a Group VII material ion implantation process on said source/drain regions with a Group VII material;
    after performing said Group VII material ion implantation process, forming a capping material layer above said source/drain regions;
    with said capping material layer in position, performing an anneal process so as to form stacking faults in said source/drain regions;
    removing said capping material layer;
    forming epi semiconductor material for said source/drain regions after removing said capping material layer;
    performing a deep source/drain ion implantation process with a dopant material after forming said epi semiconductor material; and
    performing a second anneal process to activate implanted dopant materials from said deep source/drain ion implantation process.

2. The method of claim 1, wherein said transistor is an NMOS transistor.

3. The method of claim 1, wherein said gate structure comprises a high-k gate insulation layer and a gate electrode comprised of at least one layer of metal.

4. The method of claim 1, wherein said gate structure comprises a silicon dioxide gate insulation layer and a gate electrode comprised of a layer of polysilicon.

5. The method of claim 1, wherein said Group VII material is fluorine.

6. The method of claim 1, further comprising performing an amorphization ion implantation process on said source/drain regions prior to performing said Group VII material ion implantation process.

7. The method of claim 1, further comprising performing an amorphization ion implantation process on said source/drain regions after performing said Group VII material ion implantation process.

8. The method of claim 1, wherein said Group VII material ion implantation process amorphizes a portion of said source/drain regions.

9. The method of claim 6, wherein said amorphization ion implantation process is performed using germanium or silicon.

10. The method of claim 1, wherein said anneal process is performed in an inert process ambient at a temperature of at least about 600° C.

11. The method of claim 1, wherein said Group VII material ion implantation process is performed using an implant energy that falls within the range of 1-30 keV and a dose of said Group VII material that falls within the range of $1e^{14}$-$1e^{16}$ ions/cm$^2$.

12. The method of claim 6, wherein said amorphization implantation process is performed using an implant energy that falls within the range of about 10-100 keV and an implant dose of about $1e^{14}$-$1e^{16}$ ions/cm$^2$.

13. A method of forming a transistor device comprising a gate structure and a plurality of source/drain regions, the method comprising:
    performing a source/drain extension ion implantation process with a dopant material to thereby form a doped extension implant region in said source/drain regions;
    performing an amorphization ion implantation process on said source/drain regions;
    performing a Group VII material ion implantation process on said source/drain regions with a Group VII material;
    after performing said Group VII material ion implantation process, forming a capping material layer above said source/drain regions;
    with said capping material layer in position, performing an anneal process so as to form stacking faults in said source/drain regions;
    removing said capping material layer;
    forming epi semiconductor material for said source/drain regions after removing said capping material layer;
    performing a deep source/drain ion implantation process with a dopant material after forming said epi semiconductor material; and
    performing a second anneal process to activate implanted N-type dopant materials from said deep source/drain ion implantation process.

14. The method of claim 13, wherein said Group VII material is fluorine.

15. The method of claim 13, wherein said amorphization ion implantation process is performed prior to performing said Group VII material ion implantation process.

16. The method of claim 13, wherein said amorphization ion implantation process is performed after performing said Group VII material ion implantation process.

17. The method of claim 13, wherein said amorphization ion implantation process is performed using germanium or silicon.

18. The method of claim 13, wherein said anneal process is performed in an inert process ambient at a temperature of at least about 600° C.

19. A method of forming an NMOS transistor device comprising a gate structure and a plurality of source/drain regions, the method comprising:
  performing a source/drain extension ion implantation process with an N-type dopant material to thereby form a doped extension implant region in said source/drain regions;
  performing an amorphization ion implantation process on said source/drain regions;
  performing a fluorine ion implantation process on said source/drain regions;
  after performing said fluorine ion implantation process, forming a capping material layer above said source/drain regions;
  with said capping material layer in position, performing an anneal process so as to form stacking faults in said source/drain regions;
  removing said capping material layer;
  forming epi semiconductor material for said source/drain regions after removing said capping material layer;
  performing a deep source/drain ion implantation process with a dopant material after forming said epi semiconductor material; and
  performing a second anneal process to activate implanted dopant materials from said deep source/drain ion implantation process.

20. The method of claim 19, wherein said capping material layer is a layer of silicon nitride.

21. The method of claim 19, wherein said amorphization ion implantation process is performed prior to said fluorine ion implantation process.

22. The method of claim 19, wherein said amorphization ion implantation process is performed after said fluorine ion implantation process.

23. The method of claim 19, wherein said amorphization ion implantation process is performed using germanium, silicon or fluorine.

24. The method of claim 19, wherein said anneal process is performed in an inert process ambient at a temperature of at least about 600° C.

25. The method of claim 19, wherein said fluorine ion implantation process is performed using an implant energy that falls within the range of 1-30 keV and a dose of fluorine that falls within the range of $1e^{14}$-$1e^{16}$ ions/cm$^2$.

* * * * *